United States Patent [19]

Noguchi et al.

[11] Patent Number: 5,476,752
[45] Date of Patent: Dec. 19, 1995

[54] ACTIVE ENERGY RAY-CURING RESIN COMPOSITION

[75] Inventors: Hiromichi Noguchi, Atsugi; Tadayoshi Inamoto, Machida; Megumi Munakata, Atsugi, all of Japan

[73] Assignee: Canon Kabushiki Kaisha, Tokyo, Japan

[21] Appl. No.: 415,574

[22] Filed: Apr. 3, 1995

Related U.S. Application Data

[63] Continuation of Ser. No. 65,143, Dec. 23, 1992, abandoned, which is a continuation of Ser. No. 844,940, Mar. 4, 1992, abandoned, which is a continuation of Ser. No. 251,984, Sep. 29, 1988, abandoned, which is a continuation of Ser. No. 876,081, Jun. 19, 1986, abandoned.

[30] Foreign Application Priority Data

Jun. 26, 1985 [JP] Japan .................................. 60-138037
Jul. 2, 1985 [JP] Japan .................................. 60-144001

[51] Int. Cl.$^6$ ........................................................ C08F 2/46
[52] U.S. Cl. ............................ 430/287; 522/31; 522/102; 522/126; 522/149; 525/92 D; 525/94; 525/118; 525/922
[58] Field of Search .............................. 430/287; 522/31, 522/102, 126, 149; 525/92, 94, 118, 922

[56] References Cited

U.S. PATENT DOCUMENTS

| | | | |
|---|---|---|---|
| 3,382,297 | 5/1968 | Thompson | 525/94 |
| 3,450,613 | 6/1969 | Steinberg | 522/103 |
| 3,607,977 | 9/1971 | Taylor | 525/94 |
| 3,655,826 | 4/1972 | Fellman et al. . | |
| 3,711,575 | 1/1973 | Kakefuda et al. . | |
| 3,764,324 | 10/1973 | Reyes | 522/102 |
| 4,148,967 | 4/1979 | Satoh | 522/102 |
| 4,163,809 | 8/1979 | McGinniss | 522/102 |
| 4,181,581 | 1/1980 | Iwata | 525/94 |
| 4,299,938 | 11/1981 | Green | 522/31 |
| 4,366,289 | 12/1982 | Keskkula | 525/94 |
| 4,394,670 | 7/1983 | Sugitani et al. . | |
| 4,412,224 | 10/1983 | Sugitani . | |
| 4,417,251 | 11/1983 | Sugitani . | |
| 4,429,076 | 1/1984 | Saito | 525/94 |
| 4,437,100 | 3/1984 | Sugitani et al. . | |
| 4,509,063 | 4/1985 | Sugitani et al. . | |
| 4,521,787 | 6/1985 | Yokota et al. . | |
| 4,524,183 | 6/1985 | Weber | 525/118 |
| 4,533,975 | 8/1985 | Bill . | |
| 4,554,322 | 11/1985 | Kwiecinski . | |
| 4,593,051 | 6/1986 | Koleske | 522/126 |
| 4,593,067 | 6/1986 | Nakayama | 525/92 |
| 4,688,052 | 8/1987 | Inamoto et al. . | |
| 4,688,053 | 8/1987 | Noguchi et al. . | |
| 4,688,054 | 8/1987 | Inamoto et al. . | |
| 4,688,055 | 8/1987 | Noguchi et al. . | |
| 4,688,056 | 8/1987 | Noguchi et al. . | |

FOREIGN PATENT DOCUMENTS

| | | |
|---|---|---|
| 2411753 | 10/1975 | Germany . |
| 2610437 | 9/1976 | Germany . |
| 47-47865 | 2/1972 | Japan . |
| 57-87409 | 5/1982 | Japan . |
| 2103621 | 2/1983 | United Kingdom . |

*Primary Examiner*—Mark A. Chapman
*Attorney, Agent, or Firm*—Fitzpatrick, Cella, Harper & Scinto

[57] ABSTRACT

An active energy ray-curing resin composition comprises:

(i) a linear polymer having a glass transition temperature of 50° C. or higher and a weight average molecular weight of about $3.0\times10^4$ or higher;

(ii) a monomer having an ethylenically unsaturated bond;

(iii) an epoxy resin comprising at least one compound having one or more epoxy groups in the molecule; and (iv) a polymerization initiator capable of generating a Lewis acid by irradiation with an active energy ray.

5 Claims, No Drawings

ACTIVE ENERGY RAY-CURING RESIN COMPOSITION

This application is a continuation of application Ser. No. 08/065,143, filed Dec. 23, 1992, now abandoned, which is a continuation of application Ser. No. 07/844,940, filed Mar. 4, 1992, now abandoned, which is a continuation of application Ser. No. 07/251,984, filed Sep. 29, 1988, now abaondoned, which is a continuation of application Ser. No. 06/876,081, filed Jun. 19, 1986, now abandoned.

BACKGROUND OF THE INVENTION

1. Field of the Invention

This invention relates to a resin composition which can be cured by irradiation of an active energy ray, such as UV-rays, electron beams, etc., particularly to an active energy ray curing type resin composition which is excellent in adhesion to substrates, such as glass, ceramics, plastic films, etc., in chemical resistance and in mechanical strength, also has high sensitivity and high resolution as a pattern forming material, and is suitable for formation of a pattern comprising a cured film of high precision. The active energy ray curing type resin composition is a resin composition which can be formed into a solid photosensitive sheet (dry film).

2. Related Background Art

In recent years, active energy ray curing type resins have been frequently used as coating materials, inks, sealing materials, resist materials and pattern forming materials. Active energy ray curing type resins as pattern forming materials were used for preparation of printing plates at the initial stage, but they have been recently utilized also for construction materials for precise instruments such as ink jet recording heads as disclosed in Japanese Patent Application laid-open No. 43876/1982, in addition to having been utilized in of electronic industries for print wirings, integrated circuits, etc.

Active energy ray curing type resins used in various fields as mentioned above are generally used as coating solutions or dry films. In the use thereof as solutions, advantages due to maintaining the resin film in solid state, particularly after coating and before irradiation with an active energy ray, include 1) easy formation of a thick film, 2) possible shortening of working time due to absence of fluidity and 3) easy pattern formation. On the other hand, advantages when using the resin as a dry film may include 1) formation of a pattern having a uniform and precise film thickness, 2) simple work with easy pattern formation, 3) little amount of volatiles with concomitant reduction of odor leading to no detriment to the work environment, etc.

However, active energy ray curing type resins which have hitherto been used for pattern formation, particularly dry film types, mainly utilize the curability of acrylic esters and are inferior in adhesion to a substrate. Also, such an acrylic dry film gives a pattern, by curing by irradiation with an active energy ray, which has a large tendency to absorb water absorption and is susceptible to marked deterioration in adhesiveness, mechanical strength, electrical insulation, etc., which may be considered to be caused by hydrolysis of the ester groups, particularly when contacted with an alkaline solution. For this reason, this type of resin has of poor durability when high mechanical strength or chemical resistance is demanded in protective coatings or construction materials such as for precise instruments, etc.

On the other hand, in recent years, without recourse to curability of acrylic esters as mentioned above, curing systems of epoxy resins utilizing active energy ray have been developed as disclosed in, for example, Japanese Patent Publications Nos. 14277/1977, 14278/1977 and 14294/1977. Epoxy resins in themselves have no curability with an active energy ray, but the curing systems of the epoxy resins demonstrated in the above patent publications cure the epoxy resins in the presence of a small amount of a catalyst which releases a Lewis acid by irradiation of an active energy ray, whereby a cured film having excellent water resistance, chemical resistance, mechanical strength or adhesiveness with a substrate is stated to be obtained. However, the active energy ray curing type resin utilizing the above curing system of epoxy resin can be used only in a solution, and it is difficult for it to be maintained after coating as a solid coating on a substrate, whereby it has been difficult to obtain a high precision, high resolution pattern as suited for a construction material in a precise instrument such as an ink jet recording head as mentioned above. Also, almost nothing is considered about utilization as a dry film, and this type of resin also had no satisfactory performance as a material for pattern formation of high precision and high resolution.

As described above, in the prior art, there has been no material which is capable of forming a precise pattern with excellent adhesion on various substrates, and which pattern has also high durability as a construction material.

SUMMARY OF THE INVENTION

An object of the present invention is to provide an active energy ray curing type resin composition which could not be accomplished by the active energy ray curing type resin of the prior art as described above, which is excellent in adhesion to a substrate not only when used as a coating in liquid state on a substrate but also when used in the form of dry film on a substrate, has also high sensitivity to an active energy ray and can form a precise and high resolution pattern.

Another object of the present invention is to provide an active energy ray curing type resin composition capable of being formed into a dry film convenient for formation of a pattern, which pattern formed by curing with irradiation with an active energy ray and optional heating treatment is excellent in chemical resistance and mechanical strength, and also has high durability as a construction material.

Still another object of the present invention is to provide an active energy ray curing type resin composition comprising the component (i) shown below, at least one of the components (ii) and (iii) shown below and the component (iv) shown below as the essential components:

(i) a linear polymer having a glass transition temperature of 50° C. or higher and a weight average molecular weight of about $3.0 \times 10^4$ or higher;
(ii) a monomer having an ethylenically unsaturated bond;
(iii) an epoxy resin comprising at least one compound having one or more epoxy groups in the molecule;
(iv) a polymerization initiator capable of generating a Lewis acid by irradiation of an active energy ray.

DETAILED DESCRIPTION OF PREFERRED EMBODIMENTS

The active energy ray-curing resin composition of the present invention contains as an essential component
(i) a linear polymer having a glass transition temperature of 50° C. or higher and a weight average molecular weight of about 3.0×10 or more in order to enable maintenance of said composition in the form of a solid film when using said composition as, for example, a dry film, and also imparting excellent mechanical strength to a pattern formed by curing.

If the glass transition temperature and the weight average molecular weight of the above linear polymer are lower than the above values, in producing, for example, a dry film, said composition to be formed as a solid resin layer on a substrate of e.g. a plastic film, may gradually flow during storage to generate wrinkles or cause non-uniform layer thickness, whereby no good dry film can be obtained.

Within the scope of the examples of such a linear polymer, there may be included thermoplastic copolymers of (A) a monomer, as the main component, of which its homopolymer has relatively rigid properties and can give a glass transition temperature as mentioned above and, as a second component for copolymerization contained in an amount of 40 mol% or less, a monomer selected from (B) hydroxyl containing acrylic monomers, (C) amino or alkylamino containing acrylic monomers, (D) carboxylic containing acrylic or vinyl monomers, (E) N-vinylpyrrolidone or its derivatives and (F) vinylpyridine or its derivatives which have a hydrophilic property and can impart excellent adhesiveness to the resin composition to be used in the present invention, or (G) a monomer represented by the following formula I which can give high agglomeration strength to the resin composition of the present invention and can improve mechanical strength of the composition:

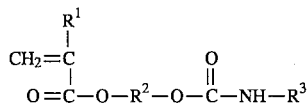  (I)

(wherein $R^1$ represents hydrogen or an alkyl group having 1 to 3 carbon atoms, $R^2$ represents a divalent hydrocarbon group which may have internally an ether bond and may be substituted with halogen atoms, and $R^3$ represents an alkyl or phenylalkyl group having 3 to 12 carbon atoms or a phenyl group).

Specific examples of the monomer to be used as the component (A) may include alkyl methacrylates having 1 to 4 carbon atoms in the alkyl group thereof such as methyl methacrylate, ethyl methacrylate, isobutyl methacrylate, t-butyl methacrylate and the like, acrylonitrile and styrene. These monomers are preferably contained in an amount of 60 mol% or more in the linear copolymer in order to impart the above glass transition temperature thereto.

Specific examples of the monomers (B)—(G) to be used as the second component are shown below. Examples of the acrylic monomer (B) containing hydroxyl group include 2-hydroxyethyl (meth)acrylate (hereinafter, (meth)acrylate includes both acrylate and methacrylate), 2-hydroxypropyl (meth)acrylate, 3-chloro-2-hydroxypropyl (meth)acrylate, 4-hydroxybutyl (meth)acrylate, 3-hydroxybutyl (meth)acrylate, 5-hydroxypentyl (meth)acrylate, 6-hydroxyhexyl (meth)acrylate, and monoester of 1,4-cyclohexanedimethanol with acrylic acid or methacrylic acid; further including those under the trade names of Aronix M5700 (produced by Toa Gosei Kagaku K. K.), TONE M100 (caprolactone acrylate, produced by Union Carbide K. K.), Light Ester HO-mpp (produced by Kyoeisha Yushi Kagaku Kogyo K. K.) or Light Ester M-600A (trade name of 2-hydroxy-3-phenoxypropyl acrylate, produced by Kyoeisha Yushi Kagaku Kogyo K. K.); monoesters of addition reaction products of divalent alcohols such as 1,10-decanediol, neopentyl glycol, bis (2-hydroxyethyl)terephthalate and bisphenol A with ethylene oxide or propylene oxide with (meth)acrylic acid; and the like.

Examples of the amino or alkylamino containing acrylic monomer (C) include (meth)acrylamide, N,N-dimethylaminoethyl-(meth)acrylamide, N,N-dimethyl(meth)acrylamide, N,N-dimethyl-aminopropyl(meth)acrylamide, N,N-di-t-butylaminoethyl(meth)-acrylamide and the like.

Examples of the carboxylic containing acrylic or vinyl monomer (D) include (meth)acrylic acid, fumaric acid, itaconic acid or those known under the trade names of Aronix M-5400, Aronix M-5500, etc., produced by Toa Gosei Kagaku K. K.

Examples of vinylpyridine or its derivatives (F) include 2-vinylpyridine, 4-vinylpyridine, 2-vinyl-6-methylpyridine, 4-vinyl-1-methylpyridine, 2-vinyl-5-ethylpyridine, 4-(4-pipenilinoethyl)pyridine and the like.

The above monomers (B)—(F) all have hydrophilic properties and impart a film adhesion property to the composition of the present invention when it is adhered to substrates such as glass, ceramics, plastic, etc.

Specific examples of the monomer (G) represented by the formula I include (α-alkyl)acrylic acid esters having one or more urethane bonds in one molecule obtained by the reaction of (α-alkyl)acrylic acid esters having one hydroxyl group in one molecule with monoisocyanate compounds. $R^2$ in the monomer represented by the formula I can be any divalent hydrocarbon group which may have internal ether bonds or be substituted with halogen atoms, and preferably $R^2$ is an alkylene group having 2 to 12 carbon atoms which may be substituted with halogen atoms, an alicyclic hydrocarbon group such as 1,4-bismethylene-cyclohexane, a hydrocarbon group containing an aromatic ring such as bisphenyl-dimethylmethane or the like.

Examples of the (meth)acrylic acid esters having at least one hydroxyl group in one molecule to be used for preparation of the monomer represented by the formula I include 2-hydroxyethyl (meth)acrylate, 2-hydroxypropyl (meth)acrylate, 3-chloro-2-hydroxypropyl (meth)acrylate, 4-hydroxybutyl (meth)acrylate, 3-hydroxybutyl (meth)acrylate, 5-hydroxypentyl (meth) acrylate, 6-hydroxyhexyl (meth)acrylate or Light Ester HO-mpp (produced by Kyoeisha Yushi Kagaku Kogyo K. K.), etc. As the (α-alkyl)acrylic acid ester having one hydroxyl group in one molecule, (a) esters of aliphatic or aromatic dihydric alcohols with (meth)acrylic acids and (b) (meth)acrylic acid esters of monoepoxy compounds can be similarly used.

Examples of the dihydric alcohol to be used in the above (a) may include 1,4-cyclohexanedimethanol, 1,10-decanediol, neopentylglycol, bis(2-hydroxyethyl) terephthalate, addition reaction product of 2 to 10 mols of ethylene oxide or propylene oxide added to bisphenol A. On the other hand, the monoepoxy compounds to be used in the above (b) may include Epolight M-1230 (trade name, produced by Kyoeisha Yushi Kagaku Kogyo K. K.), phenyl glycidyl ether, cresyl glycidyl ether, butyl glycidyl ether, octylen oxide, n-butylphenol glycidyl ether, etc.

As the monoisocyanate compound to be used for preparation of the monomer represented by the formula I, there may be included alkyl monoisocyanates comprising one isocyanate group added to alkyl groups having 3 to 12 carbon atoms, phenyl isocyanate, cresyl monoisocyanate and the like.

The monomer represented by the formula I should be contained in the linear copolymer preferably within the range up to 50 mol%. If the content exceeds 50 mol%, the composition obtained will be markedly lowered in softening point, whereby there ensue such problems that the surface hardness of the pattern obtained by curing of said composition may be lowered or that chemical resistance may be deteriorated due to swelling.

The composition of the present invention can be used in various forms such as a solution, a solid film, etc., and it is particularly advantageous to use the composition according to the embodiment of a dry film, because it can be handled easily and also the film thickness can be managed easily. Of course, there is no problem in using the composition in the form of a solution.

Having described above mainly the case of employing a thermoplastic linear polymer, it is also possible to use a linear polymer having heat crosslinkability or photo-crosslinkability in the present invention.

A heat crosslinkable linear polymer can be obtained by, for example, introducing to a thermoplastic linear polymer as described above a heat crosslinkable monomer represented by the formula II:

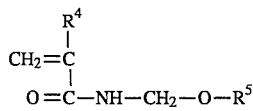

(wherein $R^4$ represents hydrogen or an alkyl or hydroxyalkyl group having 1 to 3 carbon atoms, and $R^5$ represents hydrogen or an alkyl or acyl group having 1 to 4 carbon atoms which may have hydroxy group) as the second component of copolymerization. The monomer represented by the above formula II is not only heat crosslinkable but also has hydrophilic property; through said heat crosslinkability, excellent properties for construction materials such as heat resistance, chemical resistance or mechanical strength can be exhibited in the resin composition for formation of a resin cured film in the present invention, while excellent adhesion to a substrate can be exhibited through its hydrophilic property.

Examples of the monomer represented by the formula II include N-methylol(meth)acrylamide (the expression (meth)acrylamide is intended to include both acrylamide and methacrylamide hereinbelow), N-propoxymethyl-(meth)acrylamide, N-n-butoxymethyl(meth) acrylamide, β-hydroxyethoxymethyl(meth)acrylamide, N-ethoxymethyl(meth)acrylamide, N-methoxymethyl(meth) acrylamide, N-acetoxymethyl(meth)acrylamide, α-hydroxymethyl-N-methylolacrylamide, α-hydroxyethyl-N-butoxymethylacrylamide, α-hydroxypropyl-N-propoxymethylacrylamide, α-ethyl-N-methylolacrylamide, α-propyl-N-methylolacrylamide and the like.

These monomers represented by the formula II have hydrophilic property as a matter of course, and also condensing crosslinkability by heating, and will generally form crosslinked bonds by elimination of water molecules or alcohols at a temperature of 100° C. or higher, thereby to form a network structure also in the linear copolymerized polymer itself after curing, whereby the pattern obtained by curing can be further improved in chemical resistance and mechanical strength.

When employing a linear polymer having heat curability, these monomers represented by the formula II should preferably be contained in 5 to 30 mol% in the linear polymer. With a content within the above range, satisfactory chemical resistance based on heat curability can be imparted. In contrast, if the content exceeds 30 mol%, there may occur problems such that the pattern obtained by curing may become brittle.

Other than the monomers represented by the above formula II, monomers which can be crosslinked by ring opening with heat, such as glycidyl(meth)acrylate, etc., can be used suitably as the component for copolymerization, whereby the same effect as in the case of the above formula II can be also obtained.

The photocrosslinkable linear polymer can be obtained by, for example, introducing a photopolymerizable side chain into the linear polymer according to the methods as exemplified below. Such methods may include, for example,
ⓘ the method in which a carboxylic containing monomer typically (meth)acrylic acid, etc., or an amino or tertiary amine containing monomer is copolymerized, followed by the reaction with glycidyl (meth)acrylate, etc.;

ⓙ the method in which a partial urethane compound of polyisocyanate having one isocyanate group and one or more acrylic ester groups in one molecule is reacted with the hydroxyl group, amino group or carboxyl group in the graft chain;

ⓚ the method in which acrylic acid chloride is reacted with the hydroxyl groups in the graft chain;

ⓛ the method in which an acid anhydride is reacted with the hydroxyl group in the graft chain, followed by the reaction with glycidyl (meth)acrylate;

ⓜ the method in which the hydroxyl group in the graft chain is condensed with the condensing cross-linkable monomer as exemplified in (F), thereby leaving acrylamide group in the side chain;

ⓝ the method in which the hydroxyl group in the graft chain is reacted with glycidyl (meth)acrylate; etc.

When the linear polymer in the present invention is heat crosslinkable, it is preferable to perform heating after formation of a pattern by irradiation of an active energy ray. On the other hand, also in the case of a photopolymerizable linear polymer, there is no problem in performing heating within the range permissible with respect to the heat resistance of the substrate, and rather preferable results can be obtained by heating.

The linear polymers to be used in the present invention may be classified broadly into those having no curability, those having photocrosslinkability and those having heat crosslinkability as described above. In either case, the linear polymer enables precise patterning by imparting form maintaining property to the subject composition in the curing steps thereof (namely pattern formation by active energy ray irradiation and optional heat curing), and also gives excellent adhesiveness and chemical resistance as well as high mechanical strength to the pattern obtained by curing.

The monomer (ii) having an ethylenically unsaturated bond to be used in the resin composition of the present invention is a component for permitting the resin composition of the present invention to exhibit curability with an active energy ray, particularly imparting excellent sensitivity to an active energy ray to the resin composition of the present invention, similarly as the epoxy resin (iii) as hereinafter described or together with the epoxy resin (iii). The monomer (ii) should preferably have a boiling point of 100° C. or higher under atmospheric pressure, having preferably two or more ethylenically unsaturated bonds. Various known monomers curable by irradiation of an active energy ray can be used.

Specific examples of such monomers having two or more ethylenically unsaturated bonds include ⓐ acrylic acid esters or methacrylic acid esters of polyfunctional epoxy resins having two or more epoxy groups in one molecule, ⓑ acrylic acid esters or methacrylic acid esters of alkyleneoxide adducts of polyhydric alcohols, ⓒ polyester acrylates having acrylic acid ester group at the terminal ends of the molecular chains of polyesters having molecular weights of 500 to 3000 comprising dibasic acid and dihydric alcohol, ⓓ the reaction products between polyhydric isocyanates and acrylic acid monomers having hydroxyl groups. The above monomers ⓐ-ⓓ may be urethane-modified products having urethane bonds in the molecules.

Examples of the monomers belonging to ⓐ include acrylic acid or methacrylic acid esters of polyfunctional epoxy resins to be used for the epoxy resin component (iii) as hereinafter described.

Examples of the monomers belonging to ⓑ include ethylene glycol di(meth)acrylate, diethylene glycol di(meth)acrylate, polyethylene glycol di(meth)acrylate, 1,6-hexanediol di(meth)acrylate, pentaerythritol tri(meth)acrylate and the like, and those known under the trade names KAYARAD HX-220, HX-620, D-310, D-320, D-330, DPHA, R-604, DPCA-20, DPCA-30, DPCA-60, DPCA-120 (all produced by Nippon Kayaku K. K.), and also those known under the trade names NK Ester BPE-200, BPE-500, BPE-1300, A-BPE-4 (all produced by Shin Nakamura Kagaku K. K.), etc., may also be available.

The monomers belonging to ⓒ may be exemplified by those known under the trade names Aronix M-6100, M-6200, M-6250, M-6300, M-6400, M-7100, M-8030, M-8060, M-8100 (all produced by Toa Gosei Kagaku K. K.). Examples of the monomers belonging to ⓒ and having urethane bonds of polyester include those known under the trade names Aronix M-1100, Aronix M-1200 (all produced by Toa Gosei Kagaku K. K.).

The monomers belonging to ⓓ may include the reaction products between polyisocyanates, such as tolylene diisocyanate, isophorone diisocyanate, hexamethylene diisocyanate, trimethylhexamethylene diisocyanate, lysine diisocyanate, diphenylmethane diisocyanate and the like, with hydroxyl containing acrylic monomers, and it is possible to use the reaction products having (meth)acrylic acid esters containing hydroxyl group added to polyisocyanate compounds known under the trade names Sumidule N (buret derivative of hexamethylene diisocyanate), Sumidule L (trimethylolpropane-modified product of tolylene diisocyanate) (all produced by Sumitomo Bayer Urethane K. K.), etc. The hydroxyl containing acrylic monomer as herein mentioned may include typically (meth)acrylic acid esters, preferably hydroxyethyl acrylate, hydroxyethyl methacrylate, hydroxypropyl acrylate. It is also possible to use other acrylic monomers containing hydroxyl groups which are mentioned previously as useful for producing the monomer of formula II of the linear polymer.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may be included, for example, carboxylic containing unsaturated monomers such as acrylic acid, methacrylic acid or the like; glycidyl containing unsaturated monomers such as glycidyl acrylate, glycidyl methacrylate or the like; $C_2$–$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethylene glycol or polypropylene glycol such as polyethylene glycol monoacrylate, polyethylene glycol monomethacrylate, polypropylene glycol monoacrylate, polypropylene glycol monomethacrylate or the like; $C_1$–$C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinyl pyrrolidone, dicyclopentenyloxyethyl(meth)acrylate, ε-caploractone-modified hydroxyalkyl(meth)acrylate, tetrahydrofurfulyl acrylate, phenoxyethyl acrylate; and others.

By use of the above monomer (ii) having ethylenically unsaturated bonds, high sensitivity and satisfactory curability to an active energy ray can be imparted to the composition of the present invention.

The epoxy resin (iii) comprising one or more compounds having one or more epoxy groups in one molecule to be used in the resin composition of the present invention is a component which permits the composition of the present invention to exhibit highly sensitive and satisfactory curability by an active energy ray, alone or together with the monomer (ii) having ethylenically unsaturated bonds as described above, owing to the action of the polymerization initiator (iv) as described hereinafter and, in addition thereto, imparts better adhesiveness to a substrate, water resistance, chemical resistance, dimensional stability, etc., to the cured film of the resin composition of the present invention, when it is formed by coating in liquid state on various substrates comprising glass, plastics, ceramics, etc. followed by curing, or when it is used in the form of a dry film adhered on various substrates.

In the resin composition of the present invention, any epoxy resin comprising at least one compound containing one or more epoxy groups in one molecule can be used without particular limitation. However, in view of, for example, chemical resistance or mechanical strength of the cured film obtained by curing of the resin composition of the present invention, or high durability as a construction material, or in view of workability during formation of various patterns comprising the cured film of said composition on a substrate, resolution of the patterns formed, etc., it is preferable to use an epoxy resin comprising at least one compound containing two or more epoxy groups in one molecule.

Examples of the epoxy resin comprising 2 or more epoxy groups in one molecule include epoxy resins as represented by bisphenol A type, novolac type and alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether, epoxyurethane resins represented by the following formula III:

(III)

$$CH_2\underset{O}{\underset{\diagdown\diagup}{-}}CH-CH_2-O\left[-R-O\overset{O}{\overset{\|}{C}}-NH-R_0-NH-\overset{O}{\overset{\|}{C}}-O-R-\right]_n O-CH_2-CH\underset{O}{\underset{\diagdown\diagup}{-}}CH_2$$

(wherein R represents an alkyl group or an oxyalkyl group, $R_0$ represents

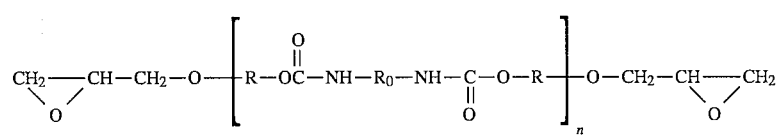

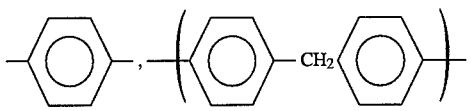

or an alkyl group), etc., and the mixtures of at least one of these.

Specific examples of these polyfunctional epoxy resins include those as mentioned below.

That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.) and Epicrone 800 (trade name, produced by Dainippon Ink Kagaku Kogyo K. K.), etc. The novolac type epoxy resin may be, for example, Epicoat 152, 154, 172 (trade names, produced by Shell Chemical Co.), Araldite EPN 1138 (trade name, produced by Ciba Geigy Co.), DER 431, 438 and 439 (trade names, produced by Dow Chemical Co.), etc. The alicyclic epoxy resin may be, for example, Araldite CY-175,-176,-179, -182,-184,-192 (trade names, produced by Ciba Geigy Co.), Chissonox 090,091, 092, 301, 313 (trade names, produced by Chisso K. K.), CYRACURE 6100, 6110, 6200 and ERL 4090, 4617, 2256, 5411 (trade names, produced by Union Carbide Co.), etc. The polyhydroric glycidyl ether of aliphatic polyhydric alcohol may be, for example, ethylene glycol diglycidyl ether, polyethylene glycol diglycidyl ether, propylene glycol diglycidyl ether, polypropylene glycol diglycidyl ether, neopentyl glycol diglycidyl ether, 1,6-hexanediol diglycidyl ether, glycerine diglycidyl ether, trimethylolpropane triglycidyl ether, diglycidyl ether of hydrogenated bisphenol A, 2,2-dibromoneopentyl glycol diglycidyl ether, etc. The polyhydric glycidiyl ether derived from aromatic polyhydric alcohol may be, for example, diglycidyl ether of an addition product of bisphenol A added with 2 to 16 mols of alkyleneoxide, diglycidyl ether of an addition product of hisphenol F added with 2 to 16 mols of alkyleneoxide, a diglycidyl ether of an addition product of bisphenol S added with 2 to 16 mols of alkyleneoxide.

On the other hand, examples of the compounds containing one epoxy group in one molecule include olefin oxides, octylene oxide, butyl glycidyl ether, glycidyl methacrylate, allyl glycidyl ether, styrene oxide, phenyl glycidyl ether, n-butylphenol glycidyl ether, 3-pentadecylphenyl glycidyl ether, cyclohexanevinyl monooxide, α-pinene oxide, glycidyl ester of tertcarboxylic acid and mixtures thereof.

These monofunctional epoxy resins can be used together with the polyfunctional epoxy resin as mentioned above or also individually alone.

To the resin composition of the present invention, the above epoxy resin (iii) provides a highly sensitive and satisfactory curability to an active energy ray owing to the action of a Lewis acid generated by irradiation with an active energy ray of a polymerization initiator (iv) as described below on the epoxy group of the epoxy resin (iii), together with the monomer (ii) having ethylenically unsaturated bonds as described above, thereby enabling precise and high resolution pattern formation upon using the composition of the present invention, as well as affording good adhesion to a substrate, chemical resistance, dimensional stability, etc., through heat curability possessed inherently by epoxy resins.

The polymerization initiator (iv) capable of generating a Lewis acid by irradiation with an active energy ray to be used in the resin composition of the present invention is a component for curing the epoxy resin (iii) as mentioned above by the action of said Lewis acid, which permits the resin composition of the present invention to exhibit highly sensitive and satisfactory curability by an active energy ray as well as the monomer (ii) having ethylenically unsaturated bonds as described above. As such a polymerization initiator (iv), there may be preferably used, for example, aromatic onium salt compounds having photo-sensitivity containing an element belonging to Group VIa as disclosed in Japanese Patent Publication No. 14278/1977 or aromatic onium salt compounds having photosensitivity containing an element belonging to Group Va as shown in Japanese Patent Publication No. 14279/1977, or aromatic halonium salts having photosensitivity as shown in Japanese Patent Publication No. 14277/1977. These aromatic onium salt compounds or aromatic halonium salts all have the characteristic of curing the epoxy resin (iii) by releasing a Lewis acid by irradiation with an active energy ray.

The aromatic onium salt compounds having photosensitivity of the element belonging to Group VIa or Group Va may include typically the compounds of the following formula IV:

$$[(R^6)_a (R^7)_b (R^8)_c X_d{}^+[MQ_e]\text{---}(e{-}f) \qquad (IV)$$

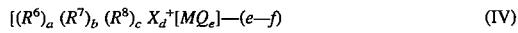

(wherein $R^6$ represents a monovalent organic aromatic group $R^7$ a monovalent organic aliphatic group selected from alkyl groups, cycloalkyl groups and substituted alkyl groups, $R^8$ a polyvalent organic group for constituting heterocyclic or fused ring structure selected from aliphatic groups and aromatic groups, X an element belonging to Group VIa selected from sulfur, selenium and tellurium or an element belonging to Group Va selected from nitrogen, phosphorus, arsenic, antimony and bismuth, M a metal or methalloid and Q a halogen atom, a is an integer of 0 to 3 when X is an element belonging to Group VIa or an integer of 0 to 4 when X is an element belonging to Group Va, b is an integer of 0 to 2, c is an integer of 0 or 1 when X is an element belonging to Group VIa or an integer of 0 to 2 when X is an element belonging to Group Va, f is an integer of 2 to 7 representing the valence of M, e is an integer which is greater than f but not more than 8, and the sum of a, b and c is 3 when X is an element belonging to the Group VIa or 4 when X is an element belonging to the Group Va, and d=e–f).

On the other hand, the photosensitive aromatic halonium salt may be exemplified by the following formula V:

$$[(R^9)_g (R^{10})_h X]_i{}^+[MQ_j]\text{---}(k{-}1) \qquad (V)$$

(wherein $R^9$ represents a monovalent aromatic organic group, $R^{10}$ a divalent aromatic organic group, X a halogen group, M a metal or metalloid and Q a halogen group, respectively, g is an integer of 0 to 2 and h is an integer of 0 or 1, with the sum of g and h being equal to the valence of X, i being equal to k–1, 1 is an integer of 2 to 7 which is equal to the valence of M and k is an integer of up to 8 which is greater than 1).

Specific examples of the photosensitive aromatic onium salt compounds containing an element belonging to Group VIa or Group Va which can be formulated in the resin composition of the present invention may include the photosensitive aromatic onium salts of the elements belonging to Group VIa as shown below:

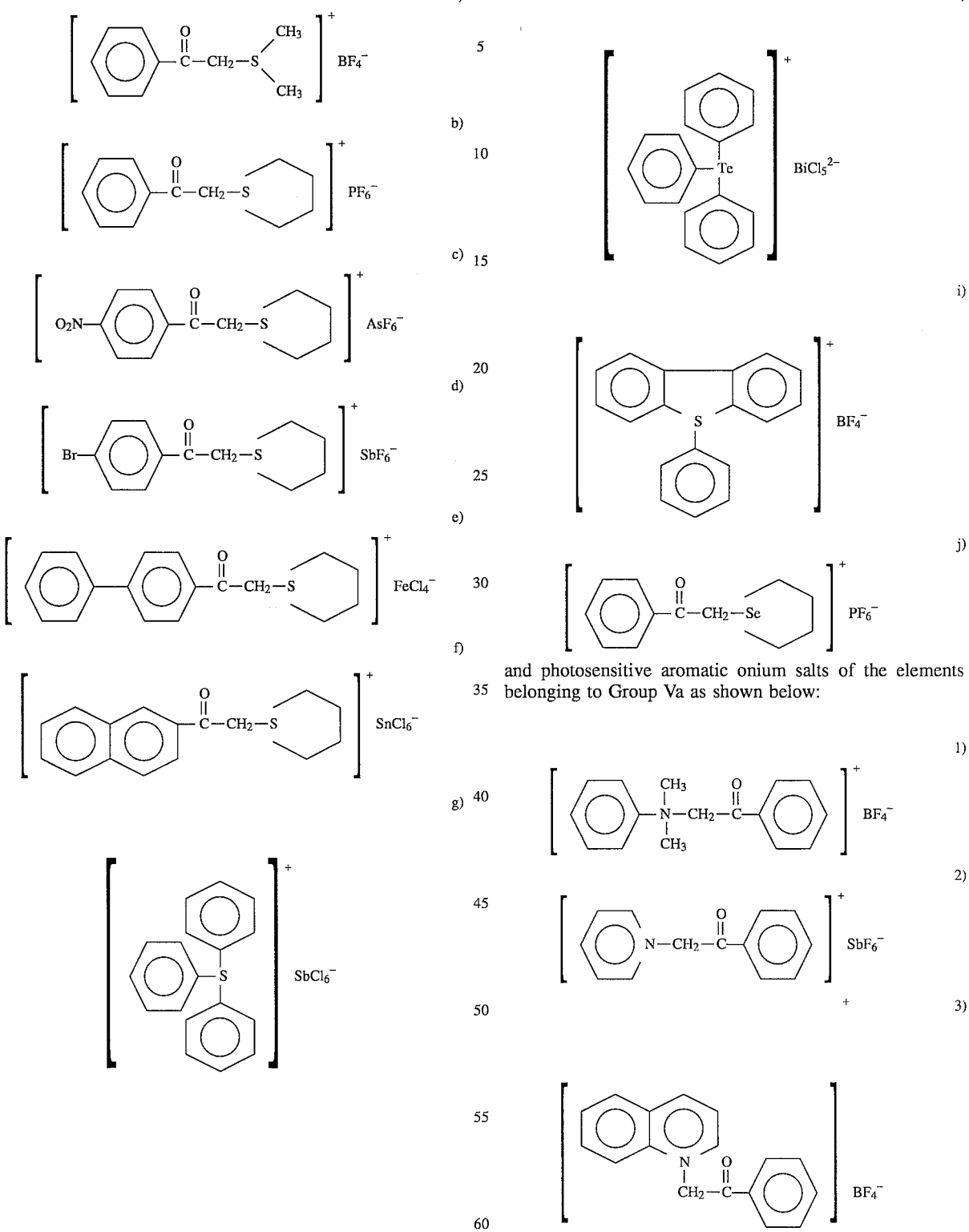
and photosensitive aromatic onium salts of the elements belonging to Group Va as shown below:

-continued
4)
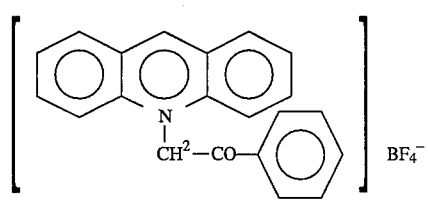
5)
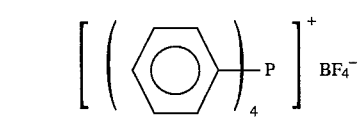
6)
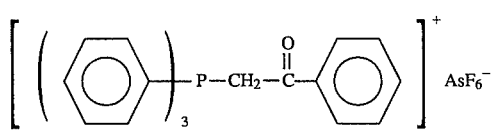
7)
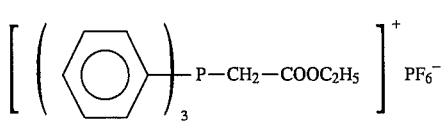
8)
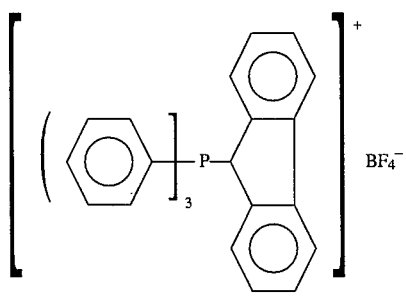
9)
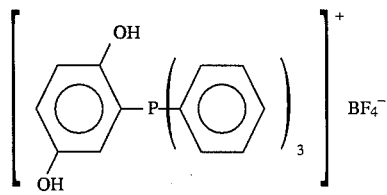
10)
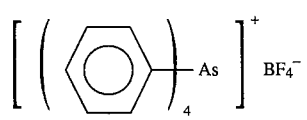
-continued
11)
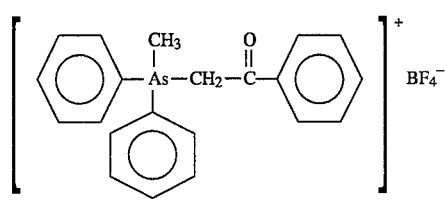
12)
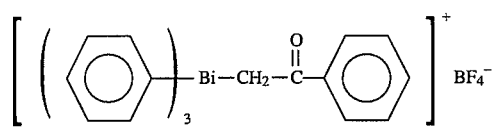
Specific example of the photosensitive aromatic halonium salts include, for example,
A)
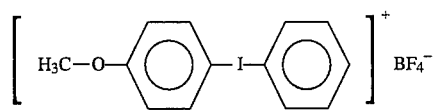
B)
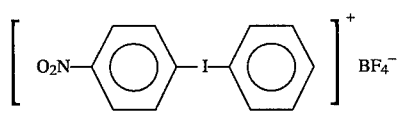
C)
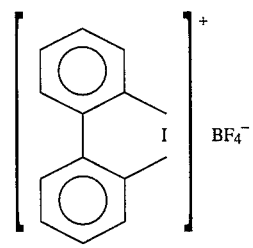
D)
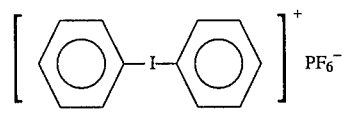
E)
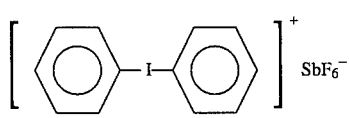

In addition to the polymerization initiator (iv) releasing a Lewis acid as described above, it is also possible to employ, if desired, curing agents generally employed widely as the curing agent for epoxy resins, such as polyamine, polyamide, acid anhydride, boron trifluoride-amine complex, dicyandiamide, imidazoles, complexes of imidazole with metal, etc.

The active energy ray to be used for curing of the active energy ray-curing resin composition of the present invention may include UV-rays or electron beams which have widely been practically applied. As a UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within a range of 0.5 to 20M Rad is practically suitable.

The active energy ray-curing resin composition of the present invention can be cured by an active energy ray as described above, and a radical polymerization initiator capable of forming organic free radicals which can be activated by the action of an active energy ray may be added in said resin composition, in addition to the polymerization initiator (iv) as herein mentioned, for the purpose of imparting further excellent curability by an active energy ray to the monomer (ii) having ethylenically unsaturated bonds as described above, or when employing a linear polymer (i) having photopolymerizability. Particularly, in the case when employing a linear polymer (i) having photo-polymerizability and using an active energy ray with wavelength of 250 nm to 450 nm, it is preferable to use the radical polymerization initiator as mentioned above together with the above polymerization initiator (iv). As the radical polymerization initiator, known substances having the property of being activated with an active energy ray, forming organic free radicals and initiating radial polymerization, can be used without any particular limitation.

Specific examples of such radical polymerization initiators include benzil benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis (N, N-diethylamino)benzophenone, benzophenone methyl ether and the like; anthraquinones such as 2-ethylanthraquinone, 2-t-butylanthraquinone and the like; xanthones such as 2,4-dimethylthioxanthone, 2,4-diisopropylthioxanthone and the like; acetophenones such as 2,2-dimethoxy-2-phenylacetophenone, α,α-dichloro-4-phenoxy-acetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g. Irugacure 184, produced by Ciba Geigy Co.), 1-(4-isopropylphenyl)-2-hydroxy-2-methylpropane-1-one (e.g. Darocure 1116, produced by MERCK Co.), 2-hydroxy-2-methyl-1-phenylpropane-1-one (Darocure 1173, produced by MERCK Co.); etc., as preferable ones. In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamylester, etc.

The constitutional ratio of the above materials constituting the active energy ray-curing resin composition of the present invention may be preferably such that L/(L+M+E) is within the range from 0.2 to 0.8 and E/(E+M) within the range from 0.3 to 0.7, wherein L is the content in parts by weight, for the linear polymer (i), M for the monomer having ethylenically unsaturated bonds (ii) and E for the epoxy resin (iii), and the polymerization initiator (iv) preferably 0.2 to 15 parts by weight per 100 parts by weight of (L+M+E) (in the above formula, either M or E may be zero).

If L/(L+M+E) is smaller than 0.2, the content of the linear polymer in the resin composition becomes so small that no satisfactory adhesiveness with a substrate based on the graft copolymerized polymer cannot be exhibited, or the drying property of the solvent, when employing a solvent, may be worsened to make the surface of the pattern obtained by curing sticky. On the other hand, if L/(L+M+E) is in excess of 0.8, the content of the monomer having ethylenically unsaturated bonds and of the epoxy resin in the resin composition of the present invention is reduced, whereby sensitivity to the active energy ray may be lowered to retard the curing speed during pattern formation, or some disadvantages may arise such as lower resolution, poor chemical resistance or poor mechanical strength of the pattern formed, etc.

When a radical polymerization initiator to be activated by the action of an activation energy ray is used in the resin composition of the present invention, said polymerization initiator may be added in an amount within the range from 0.1 to 20 parts by weight, preferably from 1 to 10 parts by weight based on 100 parts by weight of the resin components consisting of the linear polymer (i), the monomer having ethylenically unsaturated bonds (ii) and the epoxy resin (iii) [(i)+(ii)+(iii)]. In the above formula, either (ii) or (iii) may be zero.

As a solvent to be used when employing the active energy ray-curing resin composition of the present invention in the form of a solution, or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methylisobutyl ketone, etc., esters such as ethyl acetate, isobutyl acetate, etc., aromatic hydrocarbons such as toluene, xylene, etc. , and their halogen derivatives, aliphatic solvents containing chlorine such as methylene chloride, 1,1,1-trichloroethane, etc. These solvents can be also used as the developer for the composition of the present invention.

The active energy ray-curing resin composition of the present invention can further contain, in addition to the above radical polymerization initiator or the solvent as described above, additives such as catalysts for condensation crosslinking, heat polymerization inhibitors, colorants (dyes and pigments), fine particulate fillers, adhesion promotors, plasticizers, etc., if desired.

Condensation crosslinking catalysts may include sulfonic acids, typically p-toluenesulfonic acid, carboxylic acids such as formic acid, etc. Heat polymerization inhibitors may include hydroquinone and derivatives thereof, p-methoxyphenol, phenothiazine, etc. As a colorant there can be added oil-soluble dyes and pigments within the range which do not substantially prevent transmission of the active energy ray. As a filler, for enhancement of coating hardness, as well as for enhancement of coloration, adhesion or mechanical strength, there may be employed extender pigments, plastic fine particles, etc., which are used in coating materials in general. As an adhesion promotor, silane coupling agents, and low molecular weight surfactants as inorganic surface modifiers may be effectively used in the composition of the present invention.

The active energy ray-curing resin composition of the present invention as described above can be used according to the methods as exemplified below.

1) The composition of the present invention is applied on a substrate to a desired thickness within a range from 1 to 100 μm, then the solvent is dried by evaporation and irradiation with an active energy ray is effected. Then, the substrate is heated at 80° C. or higher for about 10 minutes to 3 hours. When a heat curable graft copolymerized polymer is employed, the heat treatment temperature is made at least 100° C.

2) The composition of the present invention is applied on a substrate to a desired thickness of 1 to 100 μm, followed by evaporation of the solvent. Subsequently, a mask pattern with a transmittance of the active energy ray of at least 1% or less is closely contacted on said composition, and an active energy ray is applied from above the mask. Then, development is effected with a developer dissolving said composition to remove the non-irradiated portion. Then, the substrate is heated at a temperature of at least 80° C. for about 10 minutes to 3 hours. When a heat curable linear polymer is used, the treatment temperature is at least 100° C.

3) When the composition of the present invention is provided for practical application in the form of a dry film, it is generally suitable to support said composition with a film-shaped substrate. The film-shaped substrate to be used in this case may include, for example, 16 μm–100 μm biaxially stretched polyethylene terephthalate, cellulose triacetate, poly-1-vinyl fluoride, polyvinyl chloride, polyvinylidene chloride, poly-4-methylpentene-1, polyethylene and polypropylene films and laminated or co-extruded films thereof as useful ones. As the laminating method during fabrication of a dry film by laminating said composition on a film-shaped substrate as mentioned above there may be employed well-known methods such as coating methods by use of roll coater, bar coater, etc., dipping, spray coating, brush coating, etc.

As the method for forming a pattern by use of such a dry film, for example, a dry film is secured on a desired substrate on which the pattern is to be formed by means of a laminating device which can be heated and pressurized. Next, imagewise exposure is effected by irradiation with an active energy ray after application of a masking with or without removal of the film-shaped substrate of the dry film or by selective irradiation with the active energy ray. Subsequently, the non-irradiated portion is removed with a solvent which can dissolve said dry film. Then, the substrate is heated at a temperature of 80° C. or higher for about 10 minutes to 3 hours. When a heat curable linear polymer is used, the temperature for this heating treatment is made at least 100° C.

The active energy ray-curing resin composition of the present invention has very excellent sensitivity to an active energy ray and resolution as a pattern forming material imparted primarily by the monomer having ethylenically unsaturated bonds (ii), the epoxy resin (iii) and the polymerization initiator capable of generating a Lewis acid continued as the essential components, and a high precision and high resolution pattern can be formed by use thereof.

Moreover, in the active energy ray-curing resin composition of the present invention, also the characteristics of the linear polymer (i) and the epoxy resin (iii) contained as the essential components are effectively exhibited, namely having excellent chemical resistance and dimensional stability imparted primarily by the epoxy resin (iii) in addition to excellent adhesion to the substrate and mechanical strength imparted primarily by the linear polymer (i), and the pattern formed by said composition has these excellent properties from the view point as the coating material, which is suitable for protective coating or structural material for which a long term durability is demanded.

Also, when a linear polymer having curability is used, it is possible to obtain an active energy ray-curing resin composition which is further excellent in adhesiveness, mechanical strength or chemical resistance as mentioned above.

The active energy ray-curing resin composition of the present invention can be used for protective coating of glass, adhesive, insulating layer of liquid crystal display device, or surface modification such as transparent coloration or opaque coloration on glass plate, imparting of water-proofness, water repellency, anti-stain property, etc. Also, because of its excellent chemical resistance, it is useful as the masking material for glass etching or metallizing such as electroless copper plating, etc., solder mask for print wiring plate, etc. It is also useful, because of its water resistance, for formation of minute liquid pathways, cooling pathways or nozzles, particularly for formation of nozzles in inkjet recording heads Further, it is possible to obtain a photosensitive liquid or dry film for screen printing plates which can be used for both aqueous and oily inks having high durability incomparable with other materials.

The present invention is described in more detail by referring to the following Examples.

EXAMPLE 1

Solution polymerization of methyl methacrylate, t-butyl methacrylate and dimethylaminoethyl methacrylate (=70/20/10 molar ratio) in toluene gave a linear polymer compound having a weight average molecular weight of $7.8 \times 10^4$ and a glass transition temperature of 89° C. (this is called LP-1).

By use of the LP-1, an active energy ray-curing resin composition was prepared as follows.

| | |
|---|---|
| LP-1 | 100 parts by weight |
| Epikote 828*[1] | 60 parts by weight |
| Epicrone N-655*[2] | 40 parts by weight |
| Celloxide 2021*[3] | 50 parts by weight |
| Triphenylsulfonium hexafluoroantimony | 12 parts by weight |
| Crystal Violet | 0.5 parts by weight |
| Methyl isobutyl ketone | 200 parts by weight |
| Toluene | 100 parts by weight |

*[1]bisphenol A type epoxy resin produced by Yuka-Shell Epoxy K.K., epoxy equivalent, 183–193
*[2]cresol-novolac type epoxy resin produced by Dainippon Ink Kagaku Kogyo K.K.; epoxy equivalent, 200–230
*[3]alicyclic type epoxy resin produced by Dicell Kagaku K.K., epoxy equivalent, 128–145

The composition was applied by a bar coater to a thickness after drying of about 50 μm on a Pyrex glass of 10 cm ×10 cm which had been subjected to ultrasonic cleaning treatment in a washing liquid Difreon (produced by Daikin Kogyo K. K.) and dried. On the surface of this composition, a polyethylene terephthalate film (Lumilar T type) with a thickness of 16 μm was laminated. Next, with a mask for resolution test being placed in close contact thereon, exposure was effected for 60 seconds with a high pressure mercury lamp so that the illuminance in the vicinity of 254 nm was 34 mW/cm$^2$ at the irradiated surface. After exposure, the polyethylene terephthalate film was peeled off, and development was carried out according to the spray system by use of 1,1,1-trichloroethane at 35° C. for 60 seconds. The resolution of the resin composition after development was found to accurately reproduce the line/interval pattern with a width of 250 μm.

Then, the substrate was dried by heating at 80° C. for 10 minutes, subjected to post-exposure of 10 J/cm$^2$ and further to heating at 150° C. for 30 minutes to cure fully the resin composition. When the crosscut tape peel-off test was performed for the substrate with the use of a cellophane tape for industrial use, 100/100 adhesiveness was exhibited indicating complete adhesion except for the clear scars of the crosscuts. The substrate was also dipped in an aqueous NaOH solution of pH=10.0 at 80° C. for 24 hours, followed by washing with water and drying, and again the crosscut tape peel-off test was performed. As the result, no lowering in adhesive force such as peel-off, rising, etc., was observed at all.

EXAMPLE 2

Solution polymerization of methyl methacrylate, butylcarbamylethyl methacrylate and butoxymethyl acrylamide (=80/10/10 molar ratio) in toluene gave a linear polymer compound having heat crosslinkability with a weight average molecular weight of 1.4×10$^5$ and a glass transition temperature of 75° C. (this is called LP-2).

By use of the LP-2, an active energy ray-curing resin composition having the following composition was prepared.

| | |
|---|---|
| LP-2 | 100 parts by weight |
| Epikote 1001*[4] | 60 parts by weight |
| Epicrone N-730*[5] | 40 parts by weight |
| Celloxide 2021 | 50 parts by weight |
| Triphenylsulfonium tetrafluoroborate | 12 parts by weight |
| Crystal Violet | 0.5 parts by weight |
| Methyl isobutyl ketone | 200 parts by weight |
| Toluene | 100 parts by weight |

*[4]bisphenol A type epoxy resin produced by Yuka-Shell Epoxy K.K.; epoxy equivalent, 450–500
*[5]phenol-novolac type epoxy resin produced by Dainippon Ink Kagaku Kogyo K.K.; epoxy equivalent, 170–190

The composition was applied by a bar coater to a thickness of 20 μm after drying on a 16 μm polyethylene terephthalate film (Lumilar T type). An copper laminated plate with a thickness of 35 μm of copper foil subjected to defatting, hydrochloric acid washing, water rinsing and drying was preheated to 80° C., and the above film was laminated thereon. The laminate obtained was exposed by use of a polyethyleneterephthalate film and a negative mask of a circuit pattern by means of the same exposing device as in Example 1 for 50 seconds. After exposure, development according to the spray system was carried out with a mixture of 1,1,1-trichloroethane/butyl cellosolve (=70/30 weight ratio) at 35° C. for 60 seconds. The resin composition after development was found to reproduce accurately the pattern of line/interval with a width of 200 μm.

Next, the substrate was dried by heating at 80° C. for 10 minutes, subjected to post-exposure of 10 J/cm$^2$ and further to heating at about 150° C. for 60 minutes to cure fully the resin component. Then, by use of ferric chloride of 45° Baumé, etching was effected at 30° C. under a spray pressure of 1 kg/cm$^2$ for 90 seconds to remove copper whereby a circuit of copper was obtained. The resist could be used as such for the protective film of the circuit.

The substrate was dipped in an aqueous NaOH solution of pH=12.0 and left to stand at 50° C. for 12 hours. Then, the substrate was rinsed with water, dried and subjected to the cross-cut tape peel-off test in the same manner as in Example 1. As a result, 100/100 adhesiveness was exhibited.

EXAMPLE 3

A copolymer was prepared by solution polymerization of methyl methacrylate, acrylic acid and 2-hydroxyethyl methacrylate (=70/10/20 molar ratio) in toluene. Then, glycidyl methacrylate was added in an amount equivalent to the carboxylic groups in the copolymer and the reaction was carried out at 80° C. with the use of triethylbenzylammonium chloride as the catalyst to obtain a linear polymer compound having photocrosslinkability with a weight average molecular weight of 1.1×10$^5$ and a glass transition temperature of 96° C. (this is called LP-3).

By use of the above LP-3, an active energy ray-curing resin composition was prepared as follows.

| | |
|---|---|
| LP-3 | 100 parts by weight |
| Epicrone 830*[6] | 60 parts by weight |
| Epikote 152*[7] | 60 parts by weight |
| Celloxide 2021 | 50 parts by weight |
| Diphenyliodonium tetrafluoroborate | 12 parts by weight |
| Crystal Violet | 0.5 parts by weight |
| Methyl isobutyl ketone | 200 parts by weight |
| Toluene | 100 parts by weight |

*[6]bisphenol F type epoxy resin produced by Dainippon Ink Kagaku Kogyo K.K.; epoxy equivalent 170–190
*[7]cresol-novolac type epoxy resin produced by Yuka-Shell Epoxy K.K.; epoxy equivalent 172–179

The composition was applied by a bar coater on a 16 μm polyethylene terephthalate film (Lumilar T Type) to a thickness after drying of 20 μm. The coated film was protected by pressure lamination of a 25 μm polyethylene film thereon. A 4-inch silicon wafer having a heat-oxidized film layer with a thickness of 5000 Å formed on the surface was washed by sonication in 1,1,1-trichloroethane and dried. Then, while preheating the silicon wafer at 80° C., the film as described above was laminated thereon by means of a hot roll type laminator (HRL-24, produced by Du Pont Co.) at a roll temperature of 80° C., roll pressure of 1 Kg/cm$^2$ and a laminate speed of 1 m/min while peeling off the polyethylene film therefrom. Then, with a mask for resolution test closely contacted thereon, exposure was effected for 150 seconds by means of a exposure light source for semiconductor using a deep UV lamp with an illuminance at the irradiated surface of 8 mW/cm$^2$ (PLA-501, produced by Canon K. K.). After exposure, the polyethylene terephthalate film was peeled off and development was carried out according to the spray system with the use of a mixture of 1,1,1-trichloroethane/ethanol (=70/30 weight ratio) at 35° C. for 60 seconds. The resin composition after development was found to reproduce accurately the pattern of line/interval with a width of 200 pro. Then, the substrate was heated and dried at 80° C., subjected to post-exposure of 10 J/cm² and further heated at 150° C. for 60 minutes to cure fully the resin composition.

As the next step, the resin layer was completely cut by means of a dicing saw for production of semiconductors (DAD-2H/6, produced by DISCO Co.) with a diamond blade (thickness 0.040 mm) at a delivery speed of 3 mm/sec to be cut to the depth of the substrate. The cured film without pattern was cut into checkers at 0.5 mm pitches, and the pattern portion was also cut at 0.5 mm pitches so as to cut the patterns.

When the tape peel-off test was performed on the effective film having no pattern by use of an industrial cellophane tape on the substrate, the result obtained was 100/100, indicating good adhesiveness. When the pattern cross-section was observed by a microscope, the side face of the pattern was found to have a shape substantially perpendicular to the substrate and useful as a construction material.

Next, the substrate was dipped in an NaOH aqueous solution of pH=10 and a solution of diethyleneglycol/water (=50/50 weight ratio), and the pressure cooker test was practiced under the conditions of 121° C., 2 atm. and 20 hours. After the pressure cooker test, the substrate was washed and dried in air, followed by the tape peel-off test. As a result, in either test solution, 100/100 adhesiveness was exhibited and no denaturation such as whitening, blistering, etc., of the coating was recognized at all, thus indicating excellent chemical resistance and alkali resistance.

Comparative Example 1

An active energy ray-curing resin composition was prepared as follows by use of the linear polymer compound LP-2 obtained in Example 2 having heat crosslinkability with a weight average molecular weight of $1.4 \times 10^5$.

| | |
|---|---|
| LP-2 | 100 parts by weight |
| Epoxyacrylate UE8200*[8] | 60 parts by weight |
| Epoxyacrylate UE8400 60TP*[9] | 70 parts by weight |
| Diethyleneglycol diacrylate | 30 parts by weight |
| P-toluenesulfonic acid | 7 parts by weight |
| Crystal Violet | 0.5 parts by weight |
| Methyl isobutyl ketone | 200 parts by weight |
| Toluene | 100 parts by weight |
| Benzophenone | 12 parts by weight |
| Michler's ketone | 6 parts by weight |

*[8], *[9] epoxy acrylates produced by Dainippon Ink Kagaku Kogyo K.K.

The composition was applied by a bar coater to a thickness of 20 μm after drying on a 16 μm polyethylene terephthalate film (Lumilar T type). A copper laminated plate with a thickness of copper foil of 35 μm subjected to defatting, hydrochloric acid washing, water rinsing and drying was preheated to 80° C., and the above film was laminated. On the laminate obtained was effected exposure by use of a polyethyleneterephthalate film and a negative mask of a circuit pattern by means of the same exposing device as Example 3 for 50 seconds. After exposure, development according to the spray system was carried out with a mixture of 1,1,1-trichloroethane/butyl cellosolve (=70/30) at 35° C. for 60 seconds. The resin composition after development was found to reproduce accurately the pattern of line/interval with a width of 200 μm.

Next, the substrate was dried by heating at 80° C. for 10 minutes, subjected to post-exposure of 10 J/cm² and further to heating at about 150° C. for 60 minutes to cure fully the resin component.

The substrate obtained was dipped in an aqueous NaOH solution of pH=12 and left to stand at 50° C. for 12 hours. As a result, the pattern was found to be peeled off.

Comparative Example 2

Example 2 was repeated, except that Byron 300 (weight average molecular weight: about $2.5 \times 10^4$, glass transition temperature: 7° C., produced by Toyobo K. K.) which is a linear saturated polyester having a hydroxyl terminal end was used in place of LP-2 in Example 2 to obtain an active energy ray-curing resin composition.

By use of the composition, image was formed on the epoxy-copper laminated plate in the same manner as Example 2. The resin composition after development was low in contrast during dissolution in the developer of 1,1,1-trichloroethane/butyl cellosolve (=70/30 weight ratio), leaving only the pattern of line/interval with a width of 0.5 mm to remain, with finer patterns being removed by the developing operation. That is, resolution was low.

EXAMPLE 4

By use of the LP-1 obtained in Example 1, an active energy ray-curing resin composition was prepared as follows.

| | |
|---|---|
| LP-1 | 100 parts by weight |
| Epikote 1001*[1] | 25 parts by weight |
| Celloxide 2021*[2] | 25 parts by weight |
| Trimethylpropane triacrylate | 50 parts by weight |
| Triphenylsulfonium tetrafluoroborate | 10 parts by weight |
| Irgacure 651 | 15 parts by weight |
| Crystal Violet | 1 part by weight |
| Hydroquinone | 0.2 parts by weight |
| Methyl cellosolve acetate | 300 parts by weight |

*[1]bisphenol A type epoxy resin produced by Yuka-Shell Epoxy K.K.; epoxy equivalent, 450–500
*[2]alicyclic type epoxy resin produced by Dicel Kagaku K.K.; epoxy equivalent 128–145

The composition was applied by a bar coater to a thickness after drying of about 50 μm on a Pyrex glass of 10 cm ×10 cm which had been subjected to sonication washing treatment in a washing liquid Difreon (produced by Daikin Kogyo K. K.) and dried. On the surface of this composition, a polyethylene terephthalate film with a thickness of 16 μm (Lumilar T type) was laminated. Next, with a mask for resolution test being placed in close contact thereon, exposure was effected for 60 seconds with a high pressure mercury lamp so that the illuminance in the vicinity of 254 nm was 34 mW/cm² on the irradiated surface. After exposure, the polyethylene terephthalate film was peeled off, and development was carried out according to the spray system by use of 1,1,1-trichloroethane at 35° C. for 60 seconds. The resolution of the resin composition after development was found to accurately reproduce the line/interval pattern with a width of 100 μm.

Then, the substrate was dried by heating at 80° C. for 10 minutes, subjected to post-exposure of 10 J/cm² and further to heating at 150° C. for 30 minutes to cure fully the resin composition. As the next step, the resin layer was completely cut by means of a dicing saw for production of semiconductors (DAD-2H/6, produced by DISCO Co.) with a diamond blade (thickness 0,040 mm) at a delivery speed of 3 mm/sec to be cut to the depth of the substrate. The cured film without pattern was cut into checkers at 0.5 mm pitches, and the pattern portion was also cut at 0.5 mm pitches so as to cut the patterns. When the crosscut tape peel-off test was practiced for the substrate with the use of an industrial cellophane tape, 100/100 adhesiveness was exhibited indicating complete adhesion except for the clear scars of the crosscuts.

The substrate was also dipped in an aqueous NaOH solution of pH=12 at 80° C. for 24 hours, followed by rinsing with water and drying, and again the crosscut tape peel-off test was performed. As the result, no lowering in adhesive force such as peel-off, rising, etc., was observed at all.

EXAMPLE 5

By use of the LP-2 obtained in Example 2, an active energy ray-curing resin composition was prepared as follows.

| | |
|---|---|
| LP-2 | 100 parts by weight |
| Epikote 828*[3] | 30 parts by weight |
| Epikote 152*[4] | 30 parts by weight |
| Neopentylglycol diacrylate | 80 parts by weight |
| Triphenylsulfonium tetrafluoroborate | 10 parts by weight |
| Benzophenone | 10 parts by weight |
| Michler's ketone | 5 parts by weight |
| Crystal Violet | 1 parts by weight |
| Hydroquinone | 0.1 parts by weight |
| P-toluenesulfonic acid | 5 parts by weight |
| Methyl cellosolve acetate | 300 parts by weight |

*[3]bisphenol A type epoxy resin produced by Yuka-Shell Epoxy K.K.; exopy equivalent 183–193
*[4]cresol-novolac type epoxy resin produced by Yuka-Shell Epoxy K.K.;epoxy equivalent, 172–179

The composition was applied by a bar coater to a thickness of 20 µm after drying on a 16 µm polyethylene terephthalate film (Lumilar T type). A copper laminated plate with a thickness of copper foil of 35 µm subjected to defatting, hydrochloric acid washing, water rinsing and drying was preheated to 80° C., and the above film was laminated. On the laminate obtained was effected exposure by use of a polyethyleneterephthalate film and a negative mask of a circuit pattern by means of the same exposing device as Example 4 for 50 seconds. After exposure, development according to the spray system was carried out with a mixture of 1,1,1,-trichloroethane/butyl cellosolve (=70/30 weight ratio) at 35° C. for 60 seconds. The resin composition after development was found to reproduce accurately the pattern of line/interval with a width of 80 µm.

Next, the substrate was dried by heating at 80° C. for 10 minutes, subjected to post-exposure of 10 J/cm$^2$ and further to heating at about 150° C. for 60 minutes to cure fully the resin component. Then, by use of ferric chloride of 45° Baumé, etching was effected at 30° C. under a spray pressure of 1 kg/cm$^2$ for 90 seconds to remove copper whereby a circuit of copper was obtained. The resist could be used as such for the protective film of the circuit.

The substrate was dipped in an aqueous NaOH solution of pH=12.0 and left to stand at 50° C. for 12 hours. Then, the substrate was rinsed with water, dried and subjected to the cross-cut tape peel-off test in the same manner as Example 4. As a result, 100/100 adhesiveness was exhibited.

EXAMPLE 6

By use of the LP-3 obtained in Example 3, an active energy ray-curing resin composition was prepared as follows.

| | |
|---|---|
| LP-3 | 100 parts by weight |
| Epicrone 840*[5] | 20 parts by weight |
| Epicrone 830*[6] | 20 parts by weight |
| Epicron N-730*[7] | 20 parts by weight |
| Acrylic acid ester of triglycidyl ether of trimethylolpropane | 80 parts by weight |
| Diphenyliodonium tetrafluoroborate | 10 parts by weight |
| Irgacure 651 | 15 parts by weight |
| Crystal violet | 1 part by weight |
| Hydroquinone | 0.2 parts by weight |
| Methyl cellosolve acetate | 300 parts by weight |

*[5]bisphenol A type epoxy resin produced by Dainippon Ink Kagaku Kogyo K.K.; epoxy equivalent 180–190
*[6]bisphenol F type epoxy resin produced by Dainippon Ink Kagaku Kogyo K.K.; epoxy equivalent 170–190
*[7]phenol-novolac type epoxy resin produced by Dainippon Ink Kagaku Kogyo K.K.; epoxy equivalent 170–190

The composition was applied by a bar coater on a 16 µm polyethylene terephthalate film (Lumilar T type) to a thickness after drying of 20 µm. The coated film was protected by pressure lamination of a 25 µm polyethylene film thereon. A 4-inch silicon wafer having a heat-oxidized film layer with a thickness of 5000 Å formed on the surface was washed by sonication in 1,1,1-trichloroethane and dried. Then, while preheating the silicon wafer at 80° C., the film as described above was laminated thereon by means of a hot roll type laminator (HRL-24, produced by DuPont Co.) at a roll temperature of 80° C., roll pressure of 1 Kg/cm$^2$ and a lamination speed of 1 m/min while peeling off the polyethylene film therefrom. Then, with a mask for resolution test closely contacted thereon, exposure was effected for 150 seconds by means of a exposure light source for semiconductor using a deep UV lamp with an illuminance at the irradiated surface of 8 mW/cm$^2$ (PLA-501, produced by Canon K. K.). After exposure, the polyethylene terephthalate film was peeled off and development was carried out according to the spray system with the use of a mixture of 1,1,1-trichloroethane/ethanol (=70/30 weight ratio) at 35° C. for 60 seconds. The resin composition after development was found to reproduce accurately the pattern of line/interval with a width of 80 µm. Then, the substrate was heated and dried at 80° C., subjected to post-exposure of 10 J/cm$^2$ and further heated at 150° C. for 60 minutes to cure fully the resin composition.

When the tape peel-off test was performed on the cured film having no pattern by use of an industrial cellophane tape on the substrate, the result obtained was 100/100, indicating good adhesiveness. When the pattern cross-section was observed by a microscope, the side face of the pattern was found to have a shape substantially perpendicular to the substrate and useful as a construction material.

Next, the substrate was dipped in an NaOH aqueous solution of pH=10 and a solution of diethyleneglycol/water (=50/50 weight ratio), and the pressure cooker test was performed under the conditions of 121° C., 2 atm. and 20 hours. After the pressure cooker test, the substrate was rinsed and dried on air, followed by the tape peel-off test. As a result, in either test solution, 100/100 adhesiveness was exhibited and no denaturation such as whitening, blistering, etc., of the coating was recognized at all, thus indicating excellent chemical resistance and alkali resistance.

Comparative Example 3

Example 5 was repeated, except that Byron 300 (weight average molecular weight: about $2.5 \times 10^4$, glass transitic temperature: 7° C., produced by Toyobo K. K.) which is a linear saturated polyester having a hydroxyl terminal end was used in place of LP-2 in Example i to obtain an active energy ray-curing resin composition.

By use of the composition, image was formed on the epoxy-copper laminated plate in the same manner as in Example 5. The resin composition after development was low in contrast during dissolution in the developer of 1,1,1-trichloroethane/butyl cellosolve (=70/30 weight ratio), leaving only the pattern of line/interval with a width of 0.5 mm to remain, with finer patterns being removed with the developing operation. That is, resolution was low.

As is apparent from the above Examples and Comparative examples, it can be understood that the active energy ray-curing resin composition of the present invention can form a pattern of high resolution and at the same time has high adhesion to a substrate, having also excellent mechanical strength as well as chemical resistance.

We claim:

1. An active energy ray-curing resin composition comprising:
   (i) a linear polymer having monomer selected from the group consisting of $C_1$ alkyl methacrylate, acrylonitrile and styrene, said linear polymer having a glass transition temperature of 50° C. or higher and a weight average molecular weight of at least $3.0 \times 10^4$ and containing no greater than 40 mole percent of a hydrophilic monomer component;
   (ii) a monomer having an ethylenically unsaturated bond;
   (iii) an epoxy resin selected from the group consisting of a bisphenol A epoxy resin, a cresol-novolac epoxy resin, an alicyclic epoxy resin and mixtures thereof; and
   (iv) a polymerization initiator capable of generating a Lewis acid by irradiation with an active energy ray, comprising an aromatic halonium salt compound or an aromatic onium salt compound having photosensitivity containing an element belonging to Group VIA or Group VA.

2. An active energy ray-curing resin composition according to claim 1, comprising 0.1 to 20 wt. parts of a radical polymerization initiator which can be activated by the action of an active energy ray formulated with 100 parts by weight of the total amount of the above linear polymer (i), the above monomer (ii) and the above resin (iii).

3. An active energy ray-curing resin composition according to claim 1, wherein the contents of said linear polymer (i), said monomer (ii), said epoxy resin (iii) and said polymerization initiator (iv) satisfy the following equations $$L/(L+E+M)=0.2 \text{ to } 0.8$$

$$E/(E+M)=0.3 \text{ to } 0.7, \text{ and}$$

$$I/(L+E+M)=0.002 \text{ to } 0.15$$

wherein L is the content of said linear polymer (i) in parts by weight, M is the content of said monomer (ii) in parts by weight, E is the content of said epoxy resin (iii) in parts by weight, and I is the content of said polymerization initiator (iv) in parts by weight.

4. An active energy ray-curing resin composition according to claim 1, wherein the contents of said linear polymer (i), said epoxy resin (iii) and said polymerization initiator (iv) satisfy the following equations $$L/(L+E)=0.2 \text{ to } 0.8, \text{ and}$$

$$I/(L+E)=0.002 \text{ to } 0.15$$

wherein L is the content of said linear polymer (i) in parts by weight, E is the content of said epoxy resin (iii) in parts by weight, and I is the content of said polymerization initiator (iv) in parts by weight.

5. An active energy ray-curing resin composition comprising:
   (i) a linear polymer having monomer selected from the group consisting of $C_1$ alkyl methacrylate, acrylonitrile and styrene, said linear polymer having a glass transition temperature of 50° C. or higher and a weight average molecular weight of at least $3.0 \times 10^4$ and containing no greater than 40 mole percent of a hydrophilic monomer component;
   (ii) an epoxy resin selected from the group consisting of a bisphenol A epoxy resin, a cresol-novolac epoxy resin, an alicyclic epoxy resin and mixtures thereof; and
   (iii) a polymerization initiator capable of generating a Lewis acid by irradiation with an active energy ray, comprising an aromatic halonium salt compound or an aromatic onium salt compound having photosensitivity containing an element belonging to Group VIA or Group VA.

* * * * *

UNITED STATES PATENT AND TRADEMARK OFFICE
CERTIFICATE OF CORRECTION

PATENT NO. : 5,476,752

DATED : December 19, 1995

INVENTOR(S): HIROMICHI NOGUCHI ET AL.     Page 1 of 5

It is certified that error appears in the above-identified patent and that said Letters Patent is hereby corrected as shown below:

COLUMN 1

Line 34, "of" should be deleted.
    Line 54, "absorption" should be deleted.
    Line 58, "of" (second occurrence) should be deleted.

COLUMN 2

Line 52, "molecule;" should read --molecule; and--.
    Line 56, "PREFERRED" should read --THE PREFERRED--.
    Line 63, "3.0X10" should read --$3.0 \times 10^4$--.

COLUMN 8

Line 4, "ε-caploractone-" should read --ε-caprolactone---.
    Line 5, "tetrahydrofurfulyl" should read --tetrahydrofurfuryl-.

COLUMN 9

Line 25, "090,091," should read --090,091,--.
    Line 28, "polyhydroric" should read --polyhydric--.
    Line 37, "glycidiyl" should read --glycidyl--.
    Line 50, "tertcarboxylic" should read --tert-carboxylic--.

UNITED STATES PATENT AND TRADEMARK OFFICE
CERTIFICATE OF CORRECTION

PATENT NO. : 5,476,752

DATED : December 19, 1995

INVENTOR(S) : HIROMICHI NOGUCHI ET AL.

It is certified that error appears in the above-identified patent and that said Letters Patent is hereby corrected as shown below:

<u>COLUMN 10</u>

Line 11, "photo-sensitivity" should read --photosensitivity--.

Line 27, "$[(R^6)_a(R^7)_b(R^8)_c X_d^+ [MQ_e]-(e-f)$   (IV)" should read
--$[(R^6)_a(R^7)_b(R^8)_c X]_d^+ [MQ_e]^{-(e-f)}$   (IV)--.

Line 30, "group R$^7$" should read --group, R$^7$--.

Line 38, "methalloid" shold read --metalloid--.

Line 51, "$[(R^9)_g(R^{10})_h X]_i^+ [MQ_j]-(k-l)$   (V)" should read
--$[(R^9)_g(R^{10})_h X]_i^+ [MQ_j]^{-(k-l)}$   (V)--.

<u>COLUMN 12</u>

Line 14, "$\left] BiCl_5^{2-} \right.$" should read

--$\left] BiCl_5^{-2} \right._2$--.

Line 49, "+" should be deleted.

Line 54, "┐" should read --┐$^+$--.

UNITED STATES PATENT AND TRADEMARK OFFICE
CERTIFICATE OF CORRECTION

PATENT NO. : 5,476,752

DATED : December 19, 1995

INVENTOR(S): HIROMICHI NOGUCHI ET AL.

It is certified that error appears in the above-identified patent and that said Letters Patent is hereby corrected as shown below:

COLUMN 13

Line 2, "+" should be deleted.
Line 6, "⌐" should read --⌐⁺--.

Line 37, " ⌐ " should read -- 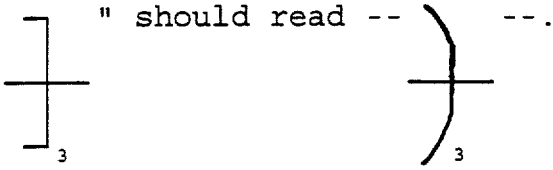 --.

COLUMN 14

Line 19, "example" should read --examples--.

COLUMN 15

Line 42, "benzil" should read --benzyl;--.

COLUMN 16

Line 12, 'no" should be deleted.
Line 47, "etc. ," should read --etc.,--.

UNITED STATES PATENT AND TRADEMARK OFFICE
CERTIFICATE OF CORRECTION

PATENT NO. : 5,476,752

DATED : December 19, 1995

INVENTOR(S) : HIROMICHI NOGUCHI ET AL.

Page 4 of 5

It is certified that error appears in the above-identified patent and that said Letters Patent is hereby corrected as shown below:

COLUMN 17

Line 66, "continued" should read --contained--.

COLUMN 19

Line 55, "An" should read --A--.

COLUMN 20

Line 58, "a" should read --an--.
Line 67, "200 pro." should read --200 $\mu$m.--.

COLUMN 22

Line 65, "0,040 mm)" should read --0.040 mm)--.

COLUMN 23

Line 30, "1 parts" should read --1 part--.
Line 34, "exopy" should read --epoxy--.

COLUMN 24

Line 37, "a" should read --an--.
Line 63, "on" should read --in--.

UNITED STATES PATENT AND TRADEMARK OFFICE
CERTIFICATE OF CORRECTION

PATENT NO. : 5,476,752

DATED : December 19, 1995

INVENTOR(S): HIROMICHI NOGUCHI ET AL.

It is certified that error appears in the above-identified patent and that said Letters Patent is hereby corrected as shown below:

COLUMN 25

Line 3, "transitic" should read --transition--.
    Line 7, "Example i" should read --Example 5--.
    Line 26, "monomer" should read --a monomer--.

COLUMN 26

Line 31, "monomer" should read --a monomer--.

Signed and Sealed this

Twentieth Day of August, 1996

BRUCE LEHMAN

*Attesting Officer*     *Commissioner of Patents and Trademarks*